United States Patent
Cho et al.

(10) Patent No.: US 11,791,416 B2
(45) Date of Patent: Oct. 17, 2023

(54) DISPLAY PANEL, METHOD FOR MANUFACTURING DISPLAY PANEL, AND DISPLAY DEVICE

(71) Applicant: HKC CORPORATION LIMITED, Shenzhen (CN)

(72) Inventors: En-Tsung Cho, Chongqing (CN); Qionghua Mo, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 285 days.

(21) Appl. No.: 17/298,015

(22) PCT Filed: Dec. 26, 2019

(86) PCT No.: PCT/CN2019/128732
§ 371 (c)(1),
(2) Date: May 27, 2021

(87) PCT Pub. No.: WO2020/143469
PCT Pub. Date: Jul. 16, 2020

(65) Prior Publication Data
US 2022/0093801 A1 Mar. 24, 2022

(30) Foreign Application Priority Data
Jan. 11, 2019 (CN) .......................... 201910024973.1

(51) Int. Cl.
*H01L 29/786* (2006.01)
*H01L 29/66* (2006.01)

(52) U.S. Cl.
CPC ...... *H01L 29/7869* (2013.01); *H01L 29/6675* (2013.01); *H01L 29/78618* (2013.01); *H01L 29/78663* (2013.01); *H01L 29/78672* (2013.01)

(58) Field of Classification Search
CPC ............ H01L 29/7869; H01L 29/6675; H01L 29/78618; H01L 29/78663;
(Continued)

(56) References Cited

U.S. PATENT DOCUMENTS

| | | | | |
|---|---|---|---|---|
| 2004/0229408 | A1* | 11/2004 | Chang | H01L 29/66757 438/149 |
| 2019/0096973 | A1* | 3/2019 | Zhou | H01L 29/513 |
| 2019/0123119 | A1* | 4/2019 | Miyamoto | H01L 29/78609 |

FOREIGN PATENT DOCUMENTS

| | | | |
|---|---|---|---|
| CN | 106646981 A * | 5/2017 | |
| CN | 106646981 A | 5/2017 | |

(Continued)

OTHER PUBLICATIONS

Dong Yan, the ISA written comments, dated Mar. 2020, CN.
Dong Yan, the International Search Report, dated Mar. 2020, CN.

*Primary Examiner* — Edward Chin

(57) ABSTRACT

This application discloses a display panel, a method for manufacturing a display panel, and a display device. The method includes steps of forming, in a display region of the display panel, a first active switch including a first semiconductor layer, and forming, in a non-display region of the display panel, a second active switch including a second semiconductor layer. A material of the first semiconductor layer formed is an oxide, a material of the second semiconductor layer formed is polysilicon, and the first semiconductor layer and the second semiconductor layer are formed on an identical layer.

7 Claims, 6 Drawing Sheets

(58) Field of Classification Search
CPC . H01L 29/78672; H01L 27/1225; G02F 1/13; G02F 1/1362; H10K 59/00
See application file for complete search history.

(56) References Cited

FOREIGN PATENT DOCUMENTS

| | | | |
|---|---|---|---|
| CN | 107346083 A | * | 11/2017 |
| CN | 107346083 A | | 11/2017 |
| CN | 108376691 A | * | 8/2018 |
| CN | 108376691 A | | 8/2018 |
| CN | 109904173 A | * | 6/2019 |
| CN | 109904173 A | | 6/2019 |
| CN | 110137182 A | * | 8/2019 |
| CN | 110137182 A | | 8/2019 |

* cited by examiner

DISPLAY PANEL, METHOD FOR MANUFACTURING DISPLAY PANEL, AND DISPLAY DEVICE

CROSS REFERENCE OF RELATED APPLICATIONS

This application claims priority to Chinese Patent Application No. CN201910024973.1, filed with the National Intellectual Property Administration, PRC on Jan. 11, 2019 and entitled "DISPLAY PANEL, METHOD FOR MANUFACTURING DISPLAY PANEL, AND DISPLAY DEVICE", which is incorporated herein by reference in its entirety.

TECHNICAL FIELD

This application relates to the field of display technology, and in particular, to a display panel, a method for manufacturing a display panel, and a display device.

BACKGROUND

The description in the background section merely provides background information related to this application, but does not necessarily constitute related art.

Each display device, whether a liquid crystal display device (Liquid Crystal Display, LCD) or an organic electroluminescence display device (organic light-emitting display, OLED), is equipped with an active switch (thin film transistor, TFT). Performance of the active switch affects performance of the display device significantly. In the display device, the active switch may be disposed in a display region (AA region) to control display of a pixel, or disposed in a non-display region such as a gate drive circuit (gate on array, GOA) region to serve as a part of the drive circuit. The active switch may be classed into an amorphous silicon active switch, a low temperature polysilicon (low temperature polysilicon, LTPS) active switch, and an oxide semiconductor active switch depending on a material of an active layer.

Although the amorphous silicon active switch is widely used in a display field, the amorphous silicon active switch is relatively large in size and can hardly implement a narrow bezel, and consumes a relatively large amount of power.

SUMMARY

An objective of this application is to provide a display panel, a method for manufacturing a display panel, and a display device to reduce both a bezel and power consumption.

This application discloses a method for manufacturing a display panel, including steps of forming, in a display region of the display panel, a first active switch including a first semiconductor layer, and forming, in a non-display region of the display panel, a second active switch including a second semiconductor layer. In such steps, a material of the first semiconductor layer formed is an oxide, a material of the second semiconductor layer formed is polysilicon, and the first semiconductor layer and the second semiconductor layer are formed on an identical layer.

This application further discloses a display panel, including a substrate. The substrate is divided into a display region and a non-display region. The display region includes a first active switch. The first active switch includes a first semiconductor layer, and the first semiconductor layer is made of an oxide material. The non-display region includes a second active switch. The second active switch includes a second semiconductor layer, and the second semiconductor layer is made of a polysilicon material. The first semiconductor layer and the second semiconductor layer are disposed on an identical layer.

This application further discloses a display device, including a display panel and a drive circuit configured to drive the display panel. The display panel is divided into a display region and a non-display region and includes a substrate. The substrate includes a first active switch and a second active switch. The first active switch is formed in the display region. The first active switch includes a first semiconductor layer, and the first semiconductor layer is made of an oxide material. The second active switch is formed in the non-display region. The second active switch includes a second semiconductor layer, and the second semiconductor layer is made of a polysilicon material. The first semiconductor layer and the second semiconductor layer are disposed on an identical layer.

This application reduces power consumption of a circuit in the display region while implementing a narrow bezel. In addition, with the first semiconductor layer and the second semiconductor layer being an identical layer, this application isolates two semiconductor layers from other conductive layers by using merely two insulation layers. In contrast, if the first semiconductor layer and the second semiconductor layer are different layers, firstly one insulation layer is needed to make different heights of the two semiconductor layers, and additionally at least two insulation layers are needed to isolate the first semiconductor layer and the second semiconductor layer from other conductive layers. Therefore, this application further reduces a manufacturing process of the insulation layer and improves production efficiency.

BRIEF DESCRIPTION OF DRAWINGS

The drawings outlined below constitute a part of the specification and are intended to enable a further understanding of the embodiments of this application, illustrate the embodiments of this application, and expound the principles of this application with reference to the text description. Apparently, the drawings outlined below are merely a part of embodiments of this application. A person of ordinary skill in the art may derive other drawings from the drawings without making any creative efforts. In the drawings.

DETAILED DESCRIPTION OF EMBODIMENTS

Figure 1:
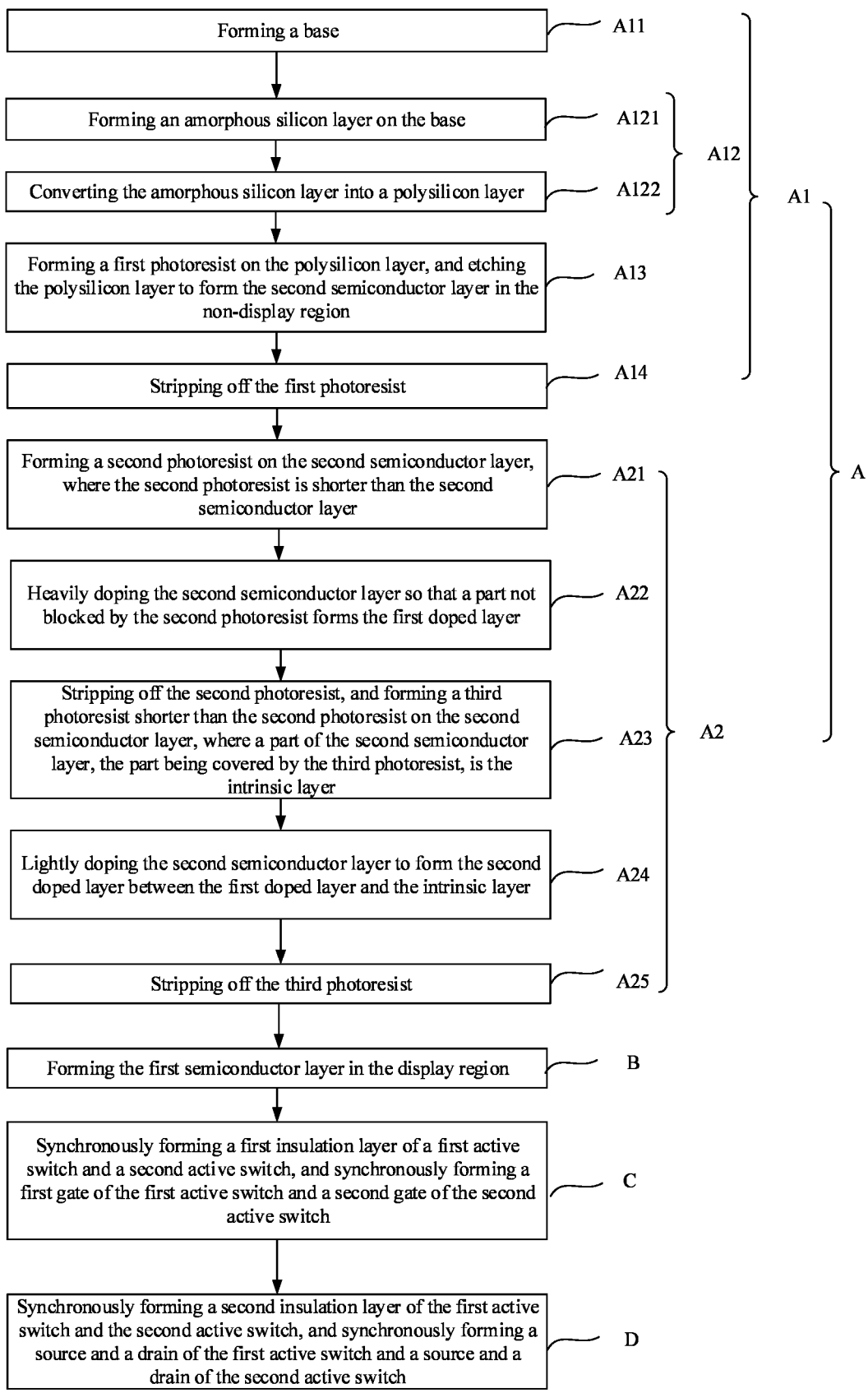
FIG. 1 is a schematic diagram of a method for manufacturing a display panel according to an embodiment of this application.

It needs to be understood that the terms, specific structures, and function details disclosed herein are merely intended for describing specific embodiments and are representative. However, this application may be specifically implemented in many substitutional forms, but is not to be construed as being limited to the embodiments described herein.

In the context of this application, the terms "first" and "second" are used merely for descriptive purposes but are not to be construed as indicating relative importance or implicitly specifying the quantity of technical features indicated. Therefore, unless otherwise specified, a feature qualified by "first" or "second" may explicitly or implicitly include one such feature or a plurality of the features. A "plurality of" means two or more. The terms "include" and "comprise" and any variations thereof mean non-exclusive inclusion, and may indicate existence or addition of one or more other features, integers, steps, operations, units, components, and/or any combinations thereof.

In addition, the terms indicating a direction or a positional relationship, such as "center", "transverse", "upper", "lower", "left", "right", "vertical", "horizontal", "top", "bottom", "inner", and "outer", are a description based on the direction or relative positional relationship shown in the drawings, and are merely intended for ease or brevity of description of this application, but do not indicate that the indicated device or component must be located in the specified direction or constructed or operated in the specified direction. Therefore, such terms are not to be understood as a limitation on this application.

In addition, unless otherwise expressly specified and qualified, the terms "mount", "concatenate", and "connect" need to be understood in a broad sense, for example, understood as a fixed connection, a detachable connection, or an integrated connection; as a mechanical connection or an electrical connection; as a direct connection or an indirect connection implemented through an intermediary; or as interior communication between two components. A person of ordinary skill in the art can understand the specific meanings of the terms in this application according to the context.

The following describes this application in further detail with reference to drawings and optional embodiments.

As shown in FIG. 1 to FIG. 4, embodiments of this application disclose a method for manufacturing a display panel 200. The method includes steps of forming, in a display region 400 of the display panel 200, a first active switch 410 including a first semiconductor layer 411, and forming, in a non-display region 500 of the display panel 200, a second active switch 510 including a second semiconductor layer 511. In such steps, a material of the first semiconductor layer 411 formed is an oxide, a material of the second semiconductor layer 511 formed is polysilicon, and the first semiconductor layer 411 and the second semiconductor layer 511 are formed on an identical layer.

The polysilicon referred to herein may be formed by using a laser method, and therefore, may be referred to as low-temperature polysilicon. Therefore, the second active switch 510 may also be referred to as a low-temperature polysilicon active switch.

In this solution, in contrast with a solution containing merely one type of active switch or containing an amorphous silicon active switch, this application combines the polysilicon active switch and the oxide semiconductor active switch. After the oxide semiconductor active switch is disposed in the display region 400, an electron mobility in the oxide semiconductor active switch can reach 2050 times that of the amorphous silicon active switch. The higher the mobility, the lower the resistivity, and the lower the power consumption when an identical current is passed. This exerts a significant effect on low-power-consumption performance of a display screen. In addition, based on an extremely high electron mobility, the display screen accomplishes a finer display effect than a usual display screen. An amorphous silicon display screen keeps refreshing data constantly even when displaying a static image, thereby naturally making the screen operate continuously and consume a large amount of power. In contrast, an oxide-type display screen adopts a mode of switching a current between ON and OFF when displaying a static image. In other words, the oxide-type display screen does not keep refreshing the image constantly, but intermittently turns on and off the current. When the refresh stops, an image that we see from the screen may be actually be understood as "buffered content" of a previously displayed image. In this way, the power consumption of the oxide-type display screen may be greatly reduced to one-fifth or even one-tenth of a usual amount. In conclusion, the oxide semiconductor active switch achieves an effect of reducing power consumption.

The electron mobility in the polysilicon active switch is more than 10 times the electron mobility in the oxide semiconductor active switch, indicating that original purposes can be achieved by using just a small quantity of polysilicon active switches. Therefore, because the polysilicon active switch is relatively small in size, an area of the non-display region 500 is reduced, thereby meeting narrow-bezel market demand. Therefore, this application reduces the power consumption of the display region 400 while implementing a narrow bezel.

In addition, with the first semiconductor layer 411 and the second semiconductor layer 511 being an identical layer, this application isolates two semiconductor layers from other conductive layers by using merely two insulation layers. In contrast, if the first semiconductor layer 411 and the second semiconductor layer 511 are different layers, firstly one insulation layer is needed to make different heights of the two semiconductor layers, and additionally at least two insulation layers are needed to isolate the first semiconductor layer 411 and the second semiconductor layer 511 from other conductive layers. Therefore, this application further reduces a manufacturing process of the insulation layer and improves production efficiency.

In one or more embodiments, as shown in FIG. 1, the steps of forming, in a display region 400 of the display panel 200, a first active switch 410 including a first semiconductor layer 411, and forming, in a non-display region 500 of the display panel 200, a second active switch 510 including a second semiconductor layer 511 include the following steps:

A: forming the second semiconductor layer in the non-display region; where step A includes:
   A1: forming an undoped second semiconductor layer in the non-display region; where step A1 includes:
      A11: forming a base;
      A12: forming a polysilicon layer on the base; where step A12 includes:
         A121: forming an amorphous silicon layer on the base; and
         A122: converting the amorphous silicon layer into a polysilicon layer;

A13: forming a first photoresist on the polysilicon layer, and etching the polysilicon layer to form the second semiconductor layer in the non-display region;

A14: stripping off the first photoresist;

A2: heavily doping and lightly doping the undoped second semiconductor layer to form an intrinsic layer, a first doped layer, and a second doped layer; where step A2 includes:

A21: forming a second photoresist on the second semiconductor layer, where the second photoresist is shorter than the second semiconductor layer;

A22: heavily doping the second semiconductor layer so that a part not blocked by the second photoresist forms the first doped layer;

A23: stripping off the second photoresist, and forming a third photoresist shorter than the second photoresist on the second semiconductor layer, where a part of the second semiconductor layer, the part being covered by the third photoresist, is the intrinsic layer;

A24: lightly doping the second semiconductor layer to form the second doped layer between the first doped layer and the intrinsic layer; and A25: stripping off the third photoresist;

B: forming the first semiconductor layer in the display region;

C: synchronously forming a first insulation layer of the first active switch and the second active switch, and synchronously forming a first gate of the first active switch and a second gate of the second active switch; and D: synchronously forming a second insulation layer of the first active switch and the second active switch, and synchronously forming a source and a drain of the first active switch and a source and a drain of the second active switch.

The source and drain of the first active switch 410, which are formed in step D, separately connect with the first semiconductor layer 411 formed in step B. The source and drain of the second active switch 510, which are formed in step D, separately connect with the second semiconductor layer 511 formed in step A.

In this solution, the second semiconductor layer 511 made of a polysilicon material is formed first, and then the first semiconductor layer 411 made of an oxide is formed. Because a structure in the second semiconductor layer 511 is relatively complicated and needs doping in addition to etching, the second semiconductor layer 511 with a complicated structure is processed first to prevent being affected by the first semiconductor layer 411, and to improve the manufacturing efficiency of the second semiconductor layer 511.

In one or more embodiments, the second semiconductor layer 511 may skip being doped in step A. To be specific, in step A, step A1 alone is performed but step A2 is not performed. This does not affect a function of the second active switch 510. In this solution, a doping step is saved, and the production efficiency is improved.

In one or more embodiments, step A1 may also be: first, forming an amorphous silicon layer on the base 310, then forming a photoresist on the amorphous silicon, and then etching the amorphous silicon layer to form the second semiconductor layer 511 in the non-display region 500, and finally, stripping off the photoresist.

In the foregoing embodiment, the photoresist may be stripped off by means of dry stripping and wet stripping, and is usually stripped off by means of wet stripping by using a colorless, transparent, and pungent stripping liquid mixed at a ratio of DMSO:MEA=7.3 (mass ratio). The polysilicon layer may be etched by means of dry etching, and may be etched by using hydrogen bromide (HBr) as an etching gas. The amorphous silicon layer may be etched by means of dry etching, and may be etched by means of fluorine-based or chlorine-based plasma etching by using an etching gas such as $CH_4$, $CHF_3$, $SF_6$, $NF_3$, $Cl_2$, $CF_2Cl_2$, and $SiCl_4$.

In one or more embodiments, a step of forming a buffer layer on the base may be added between step A11 and step A12. In this solution, the base 310 is generally made of glass containing metal impurities. Without the buffer layer 320, the metal impurities may run to an active layer. This may cause a short circuit and affect a yield rate of the display panel.

In step A122, a method for converting the amorphous silicon layer into a polysilicon layer may be a laser method. In this method, the amorphous silicon layer is subjected to solid phase crystallization (SPC) so that the amorphous silicon in the amorphous silicon layer is converted into polysilicon to form the polysilicon layer. In addition, excimer laser annealing (ELA) may also serve a function of converting the amorphous silicon layer into the polysilicon layer.

Figure 2:
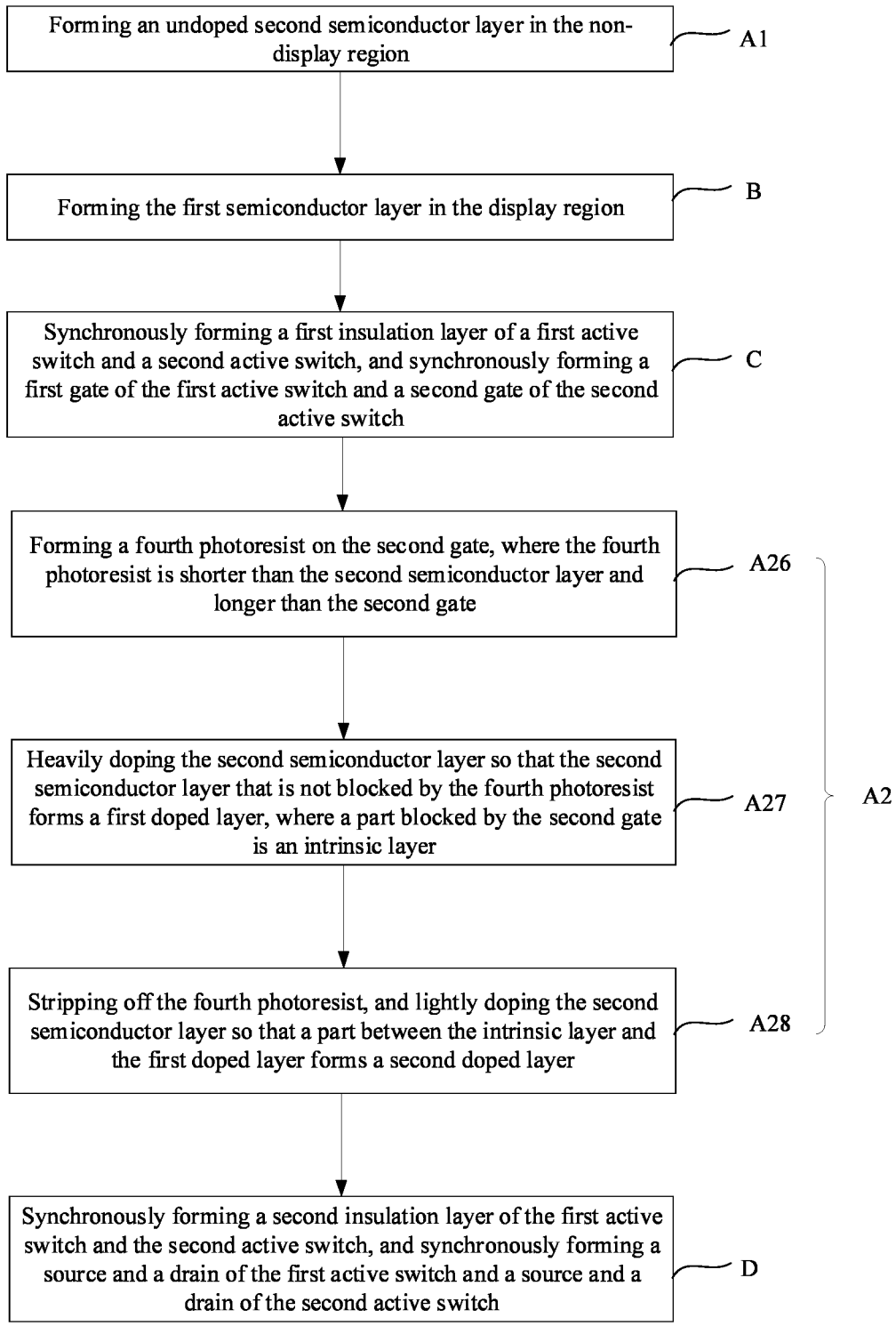
FIG. 2 is a schematic diagram of a method for manufacturing a display panel according to another embodiment of this application.

In one or more embodiments of this application, as shown in FIG. 2, the embodiment of this application further discloses a method for manufacturing a display panel 200, including the following steps:

A1: forming an undoped second semiconductor layer in a non-display region;

B: forming a first semiconductor layer in a display region;

C: synchronously forming a first insulation layer of a first active switch and a second active switch, and synchronously forming a first gate of the first active switch and a second gate of the second active switch;

A2: heavily doping and lightly doping an undoped second semiconductor layer to form an intrinsic layer, a first doped layer, and a second doped layer; where step A2 includes:

A26: forming a fourth photoresist on the second gate, where the fourth photoresist is shorter than the second semiconductor layer and longer than the second gate;

A27: heavily doping the second semiconductor layer so that the second semiconductor layer that is not blocked by the fourth photoresist forms a first doped layer, where a part blocked by the second gate is the intrinsic layer; and A28: stripping off the fourth photoresist, and lightly doping the second semiconductor layer so that a part between the intrinsic layer and the first doped layer forms a second doped layer;

D: synchronously forming a second insulation layer of the first active switch and the second active switch, and synchronously forming a source and a drain of the first active switch and a source and a drain of the second active switch.

The source and drain of the first active switch 410, which are formed in step D, separately connect with the first semiconductor layer 411 formed in step B. The source and drain of the second active switch 510, which are formed in step D, separately connect with the second semiconductor layer 511 formed in step A.

In this solution, in doping the second semiconductor layer 511, the gate is used to replace a photoresist, thereby reducing time of manufacturing the photoresist. In the foregoing embodiment, the second semiconductor layer 511 needs to be doped with an insulation layer in between.

Therefore, a power needs to be increased in an ion implantation process to ensure that a doping component can enter the second semiconductor layer 511.

Figure 3:
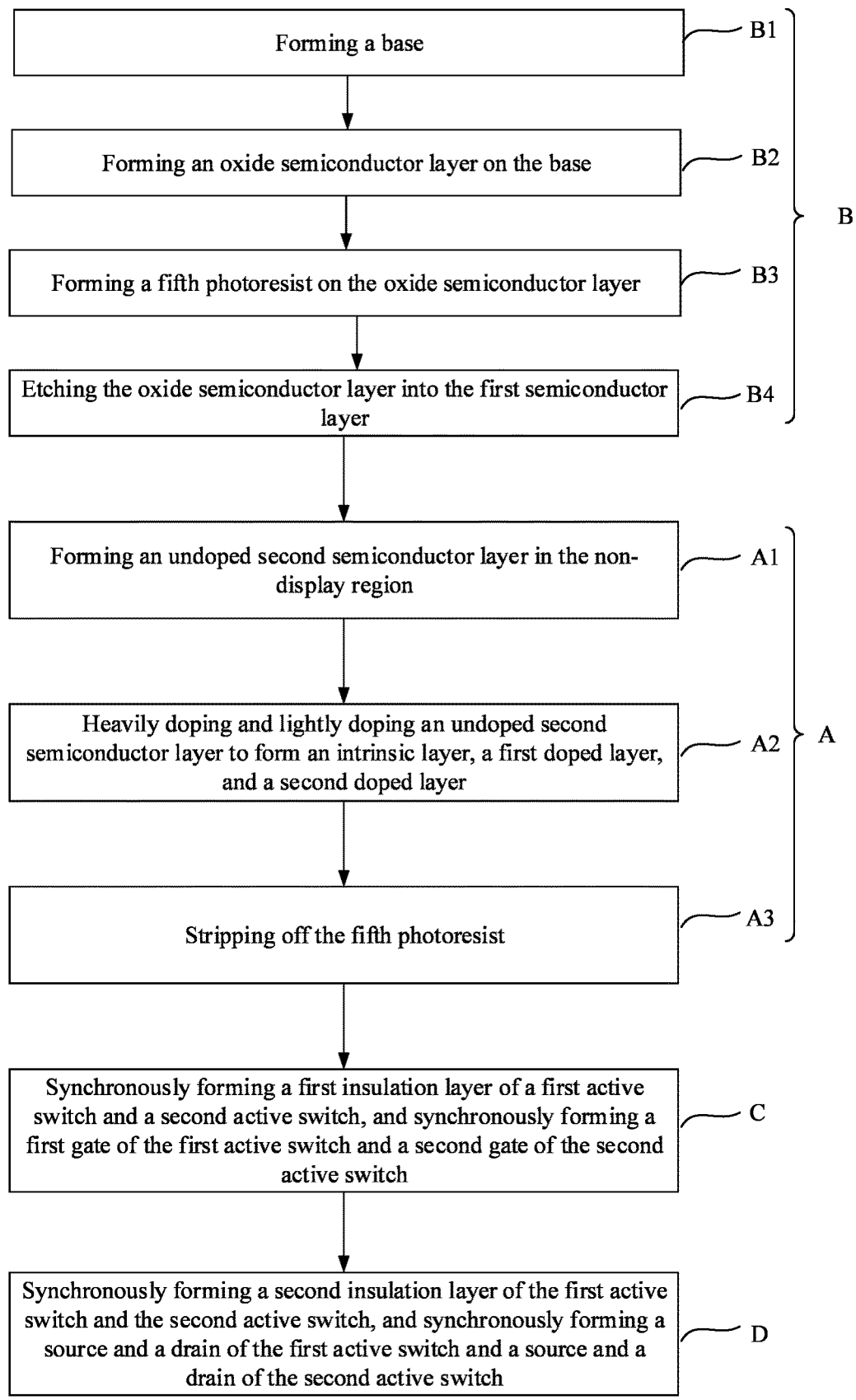
FIG. 3 is a schematic diagram of a method for manufacturing a display panel according to another embodiment of this application.

In one or more embodiments of this application, as shown in FIG. 3, the embodiment of this application further discloses a method for manufacturing a display panel 200, including the following steps:
- B: forming a first semiconductor layer in a display region; where step B includes:
  - B1: forming a base;
  - B2: forming an oxide semiconductor layer on the base;
  - B3: forming a fifth photoresist on the oxide semiconductor layer; and
  - B4: etching the oxide semiconductor layer into the first semiconductor layer;
- A: forming a second semiconductor layer in a non-display region; where step A includes:
  - A1: forming an undoped second semiconductor layer in the non-display region;
  - A2: heavily doping and lightly doping an undoped second semiconductor layer to form an intrinsic layer, a first doped layer, and a second doped layer; and
  - A3: stripping off the fifth photoresist;
- C: synchronously forming a first insulation layer of a first active switch and a second active switch, and synchronously forming a first gate of the first active switch and a second gate of the second active switch; and
- D: synchronously forming a second insulation layer of the first active switch and the second active switch, and synchronously forming a source and a drain of the first active switch and a source and a drain of the second active switch.

In this solution, the first semiconductor layer 411 made of an oxide material is formed first, and then the second semiconductor layer 511 made of a polysilicon material is formed. The material of the first semiconductor layer is similar to that of a general-purpose transparent electrode layer 370, and is relatively fragile, and therefore, a flat environment is required. Therefore, firstly, the first semiconductor layer 411 is formed on the base 310, thereby being conducive to formation of the first semiconductor. In addition, after the step of manufacturing the first semiconductor layer 411 is completed, the fifth photoresist above the first semiconductor layer is not stripped off until the second semiconductor layer 511 is converted, etched, and doped. In this way, the fifth photoresist also serves as a barrier against laser light, an etching solution, and a doping element, and helps the first semiconductor layer 411 to remain intact.

Figure 4:
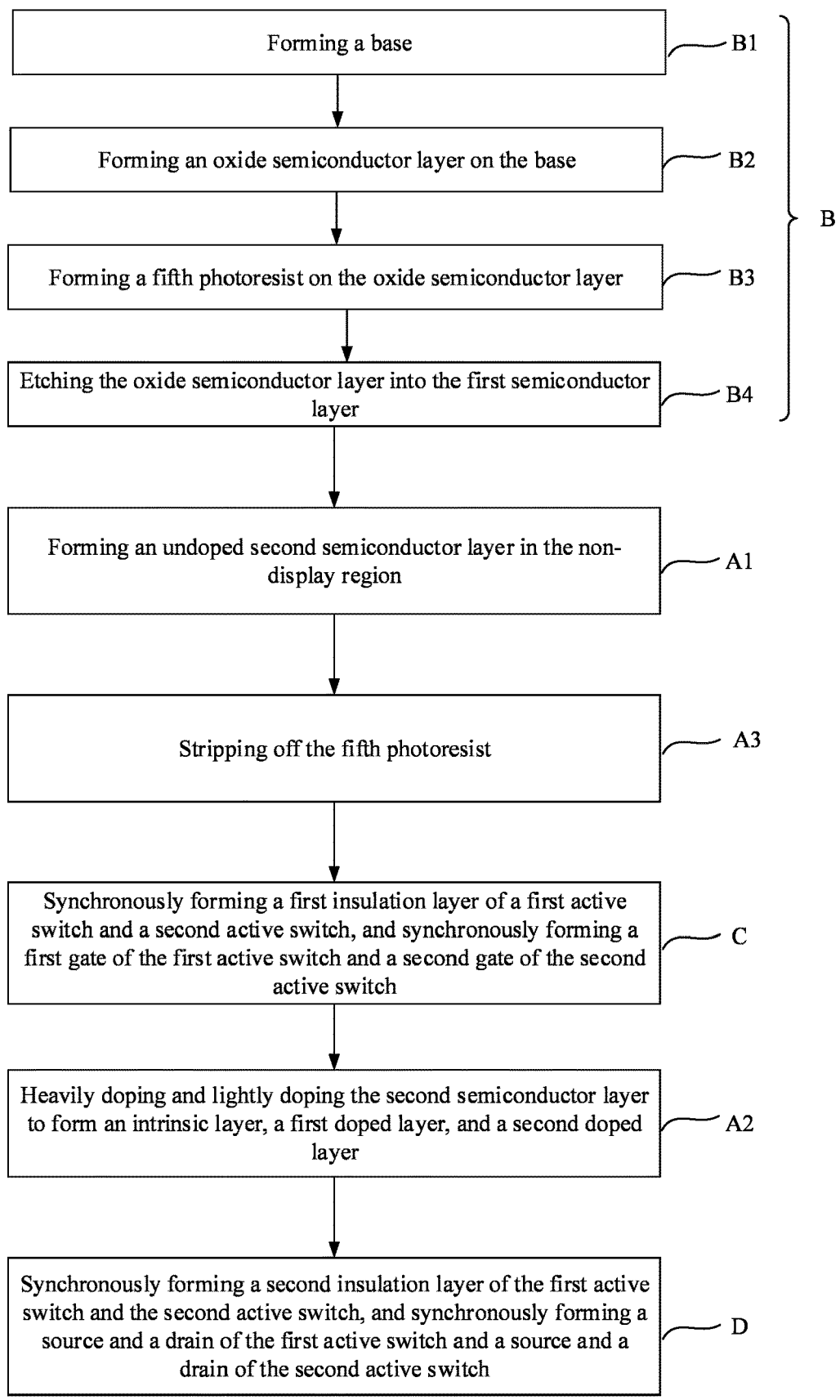
FIG. 4 is a schematic diagram of a method for manufacturing a display panel according to another embodiment of this application.

In one or more embodiments of this application, as shown in FIG. 4, the embodiment of this application further discloses a method for manufacturing a display panel 200, including the following steps:
- B1: forming a base;
- B2: forming an oxide semiconductor layer on the base;
- B3: forming a fifth photoresist on the oxide semiconductor layer;
- B4: etching the oxide semiconductor layer into the first semiconductor layer;
- A1: forming an undoped second semiconductor layer in the non-display region;
- A3: stripping off the fifth photoresist;
- C: synchronously forming a first insulation layer of a first active switch and a second active switch, and synchronously forming a first gate of the first active switch and a second gate of the second active switch;
- A2: heavily doping and lightly doping an undoped second semiconductor layer to form an intrinsic layer, a first doped layer, and a second doped layer; and
- D: synchronously forming a second insulation layer of the first active switch and the second active switch, and synchronously forming a source and a drain of the first active switch and a source and a drain of the second active switch.

Figure 5:
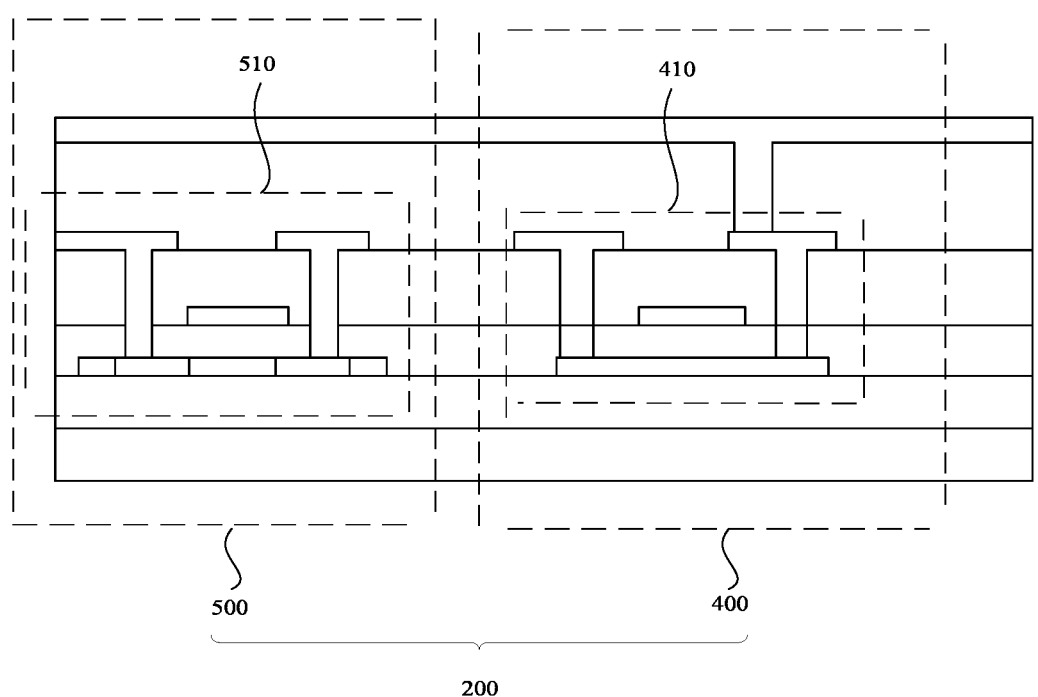
FIG. 5 is a schematic diagram of a display panel according to another embodiment of this application.
Figure 6:
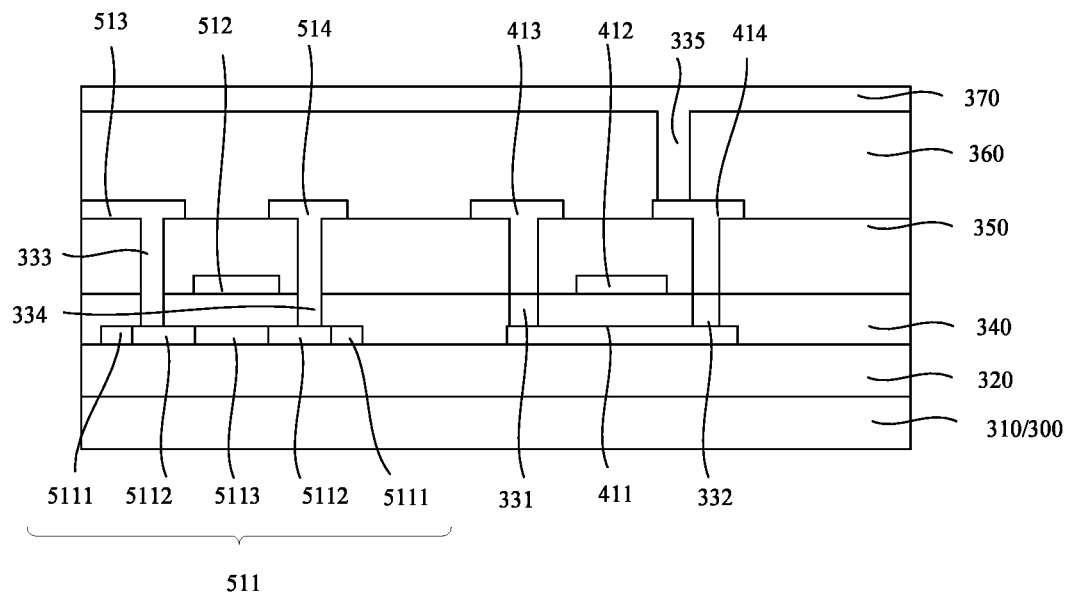
FIG. 6 is a schematic diagram of a display panel according to an embodiment of this application.

In one or more embodiments of this application, as shown in FIG. 5 and FIG. 6, this application discloses a display panel 200, divided into a display region 400 and a non-display region 500 and including a substrate 300. The substrate 300 includes: a first active switch 410, formed in the display region 400, where the first active switch 410 includes a first semiconductor layer 411, and the first semiconductor layer 411 is made of an oxide material; and a second active switch 510, formed in the non-display region 500, where the second active switch 510 includes a second semiconductor layer 511, and the second semiconductor layer 511 is made of a polysilicon material. The first semiconductor layer 411 and the second semiconductor layer 511 are disposed on an identical layer. The first active switch 410 includes a first thin film transistor. The second active switch 510 includes a second thin film transistor. The first thin film transistor and the second thin film transistor are thin film transistors that are turned on at a high level.

In this application, after semiconductors of the two types of active switches are disposed on one layer, merely two insulation layers, that is, an upper insulation layer and a lower insulation layer, are required to isolate the semiconductor layer. If the semiconductors of the two types of active switches are not disposed on one layer, then at least three insulation layers are required to isolate the semiconductor layer. Therefore, this application further reduces manufacturing steps.

In one or more embodiments, a first semiconductor may be at least one of an IGZO (indium gallium zinc oxide, indium-gallium-zinc oxide), $In_2O_3$ (indium oxide, indium oxide), IZO (Indium Zinc Oxide, indium zinc oxide), and IGZO (indium gallium zinc oxide, indium-gallium-zinc oxide). Optionally, the first semiconductor herein may be an IGZO semiconductor. Because a technology of using the IGZO as a semiconductor is more mature, the first thin film transistor is also an IGZO thin film transistor. In addition, the second thin film transistor is a LTPS (Low Temperature Poly-silicon, low-temperature polysilicon) thin film transistor.

In one or more embodiments, as shown in FIG. 6, the first thin film transistor includes a first gate 412, and the second thin film transistor includes a second gate 512. The first gate 412 and the second gate 512 are disposed on an identical layer. In this solution, the two types of gates are disposed on the identical layer. In forming the gates, the first gate 412 and the second gate 512 can be processed simultaneously through one photomask process, thereby reducing manufacturing steps and improving manufacturing efficiency.

In one or more embodiments, the substrate 300 includes a base 310. The first semiconductor layer 411 is disposed between the first gate 412 and the base 310, and the second semiconductor layer 511 is disposed between the second gate 512 and the base 310. In this solution, the first thin film transistor and the second thin film transistor adopt a top-gate structure to prevent external light from radiating on the polysilicon, generating a photocurrent, and affecting a display effect. Alternatively, both the first gate 412 and the second gate 512 may be disposed between the base 310 and the semiconductor layer to reduce an impact of a backlight source on the polysilicon. Moreover, the first gate 412 and the second gate 512 may skip being disposed on an identical layer. This is not limited herein.

In one or more embodiments, the substrate 300 includes a buffer layer 320. The buffer layer 320 is disposed between the base 310 and the first semiconductor layer 41.

In one or more embodiments, the first thin film transistor includes a first source 413 and a first drain 414. The second thin film transistor includes a second source 513 and a second drain 514. The first source 413, the first drain 414, the second source 513, and the second drain 514 are disposed on an identical layer. In this solution, the source and drain of the first thin film transistor and the source and drain of the second thin film transistor are disposed on the identical layer. In forming the sources and drains, the first source 413, the first drain 414, the second source 513, and the second drain 514 can be processed simultaneously through one photomask process, thereby reducing manufacturing steps and improving manufacturing efficiency.

In one or more embodiments, the substrate 300 includes a first via hole 331, a second via hole 332, a third via hole 333, and a fourth via hole 334. The first source 413 is connected to one end of the first semiconductor layer 411 through the first via hole 331. The first drain 414 is connected to another end of the first semiconductor layer 411 through the second via hole 332. The second source 513 is connected to one end of the second semiconductor layer 511 through the third via hole 333. The second drain 514 is connected to another end of the second semiconductor layer 511 through the fourth via hole 334. A position of the first gate 412 corresponds to a position of the first semiconductor layer 411, and a width of the first gate 412 is smaller than a width of the first semiconductor layer 411. A position of the second gate 512 corresponds to a position of the second semiconductor layer 511, and a width of the second gate 512 is smaller than a width of the second semiconductor layer 511.

In this solution, the width of the first gate 412 is smaller than the width of the first semiconductor layer 411, and the width of the second gate 512 is smaller than the width of the second semiconductor layer 511. In this way, no interference is caused in processing the first via hole 331, the second via hole 332. the third via hole 333, and the fourth via hole 334.

In one or more embodiments, the second semiconductor layer 511 includes two first doped layers 5111, two second doped layers 5112, and an intrinsic layer 5113. An arrangement form of the two first doped layers 5111, the two second doped layers 5112, and the intrinsic layer 5113 is: the first doped layer 5111, the second doped layer 5112, the intrinsic layer 5113, the second doped layer 5112, and the first doped layer 5111. The third via hole 333 and the fourth via hole 334 correspond to the first doped layers 5111. The width of the second gate 512 is equal to a width of the intrinsic layer 5113. In this solution, in doping the second semiconductor layer 511, the second gate 512 may serve as a photoresist to prevent the intrinsic layer 5113 from being doped. Therefore, setting the width of the intrinsic layer 5113 to be equal to the width of the second gate 512 can save a photoresist manufacturing process in forming the first doped layer 5111 and the second doped layer 5112. The first doped layer 5111 is a heavily doped layer, and the second doped layer 5112 is a lightly doped layer. The first doped layer 5111 and the second doped layer 5112 are doped with phosphorus.

In one or more embodiments, as shown in FIG. 6, the substrate 300 further includes a first insulation layer 340, a second insulation layer 350, a third insulation layer 360, a fifth via hole 335, and a transparent electrode layer 370. The buffer layer 320 is disposed above the base 310. The first semiconductor layer 411 and the second semiconductor layer 511 are disposed above the buffer layer 320. The first insulation layer 340 is disposed above the first semiconductor layer 411 and the second semiconductor layer 511. The first gate 412 and the second gate 512 are disposed above the first insulation layer 340. The second insulation layer 350 may be disposed above the first gate 412 and the second gate 512. The first source 413, the first drain 414, the second source 513, and the second drain 514 are disposed above the second insulation layer 350. The first via hole 331 makes the first source 413 connect with the first semiconductor layer 411. The second via hole 332 makes the first drain 414 connect with the first semiconductor layer 411. The third via hole 333 makes the second source 513 connect with the second semiconductor layer 511. The fourth via hole 334 makes the second drain 514 connect with the second semiconductor layer 511. The third insulation layer 360 is disposed above the first source 413, the first drain 414, the second source 513, and the second drain 514. The transparent electrode layer 370 is disposed above the third insulation layer 360. The fifth via hole 335 makes the transparent electrode layer 370 connect with the first drain 414.

Figure 7:
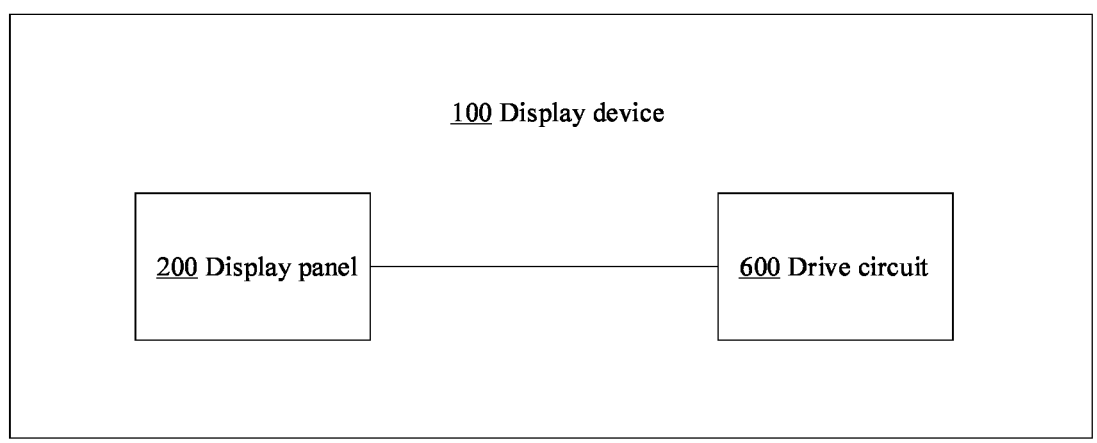
FIG. 7 is a schematic diagram of a display device according to another embodiment of this application.

As shown in FIG. 7, as another embodiment of this application, a display device 100 is disclosed, including the display panel 200 and a drive circuit 600 configured to drive the display panel 200.

It needs to be noted that, to the extent that the implementation of the specific solution is not affected, no limitation on a step in this solution is considered to be a limitation on the order of steps. A step written before another step may be performed before or after the other step, or even performed simultaneously. All variations capable of implementing this solution fall within the protection scope of this application.

The technical solution of this application is widely applicable to various display panels, for example, a twisted nematic (twisted nematic, TN) display panel, an in-plane switching (in-plane switching, IPS) display panel, a vertical alignment (vertical alignment, VA) display panel, and a multi-domain vertical alignment (multi-domain vertical alignment, MVA) display panel, and may also be applicable to other types of display panels such as an organic light-emitting diode (organic light-emitting diode, OLED) display panel.

The foregoing content is a detailed description of this application made with reference with specific optional embodiments, but the specific implementation of this application is not limited to such description. Simple derivations or replacements may be made by a person of ordinary skill in the art of this application without departing from the conception of this application, and all such derivations and replacements fall within the protection scope of this application.

What is claimed is:

1. A method for manufacturing a display panel, comprising steps of forming, in a display region of the display panel, a first active switch comprising a first semiconductor layer, and forming, in a non-display region of the display panel, a second active switch comprising a second semiconductor layer, wherein
   a material of the first semiconductor layer formed is an oxide, a material of the second semiconductor layer formed is polysilicon, and the first semiconductor layer and the second semiconductor layer are formed on an identical layer;
   wherein the steps of forming, in a display region of the display panel, a first active switch comprising a first semiconductor layer, and forming, in a non-display region of the display panel, a second active switch comprising a second semiconductor layer comprise the following steps:

forming the second semiconductor layer in the non-display region;

forming the first semiconductor layer in the display region;

synchronously forming a first insulation layer of the first active switch and the second active switch, and synchronously forming a first gate of the first active switch and a second gate of the second active switch; and synchronously forming a second insulation layer of the first active switch and the second active switch, and synchronously forming a source and a drain of the first active switch and a source and a drain of the second active switch, wherein in the steps of synchronously forming a second insulation layer of the first active switch and the second active switch, and synchronously forming a source and a drain of the first active switch and a source and a drain of the second active switch, the formed source and drain of the first active switch separately connect with the first semiconductor layer of the first active switch, and the formed source and drain of the second active switch separately connect with the second semiconductor layer of the second active switch;

wherein the step of forming the second semiconductor layer in the non-display region comprises the following steps:

forming a base;

forming an amorphous silicon layer on the base;

converting the amorphous silicon layer into a polysilicon layer;

forming a first photoresist on the polysilicon layer, and etching the polysilicon layer to form the second semiconductor layer in the non-display region;

stripping off the first photoresist; and heavily doping and lightly doping an undoped second semiconductor layer to form an intrinsic layer, a first doped layer, and a second doped layer.

2. The method for manufacturing a display panel according to claim 1, wherein the step of heavily doping and lightly doping the undoped second semiconductor layer to form an intrinsic layer, a first doped layer, and a second doped layer comprises the following steps:

forming a second photoresist on the second semiconductor layer, wherein the second photoresist is shorter than the second semiconductor layer;

heavily doping the second semiconductor layer so that a part not blocked by the second photoresist forms the first doped layer;

stripping off the second photoresist, and forming a third photoresist shorter than the second photoresist on the second semiconductor layer, wherein a part of the second semiconductor layer, the part being covered by the third photoresist, is the intrinsic layer;

lightly doping the second semiconductor layer to form the second doped layer between the first doped layer and the intrinsic layer; and stripping off the third photoresist.

3. The method for manufacturing a display panel according to claim 1, wherein the step of converting the amorphous silicon layer into a polysilicon layer comprises:

converting the amorphous silicon layer into the polysilicon layer through a laser process.

4. The method for manufacturing a display panel according to claim 1, wherein after the step of forming a base, the method further comprises a step of forming a buffer layer on the base.

5. The method for manufacturing a display panel according to claim 1, wherein the step of forming the first semiconductor layer in the display region comprises the following steps:

forming a base;

forming an oxide semiconductor layer on the base;

forming a fifth photoresist on the oxide semiconductor layer; and etching the oxide semiconductor layer into the first semiconductor layer.

6. A method for manufacturing a display panel, comprising steps of forming, in a display region of the display panel, a first active switch comprising a first semiconductor layer, and forming, in a non-display region of the display panel, a second active switch comprising a second semiconductor layer, wherein a material of the first semiconductor layer formed is an oxide, a material of the second semiconductor layer formed is polysilicon, and the first semiconductor layer and the second semiconductor layer are formed on an identical layer;

wherein the steps of forming, in a display region of the display panel, a first active switch comprising a first semiconductor layer, and forming, in a non-display region of the display panel, a second active switch comprising a second semiconductor layer comprise the following steps:

forming the second semiconductor layer in the non-display region;

forming the first semiconductor layer in the display region;

synchronously forming a first insulation layer of the first active switch and the second active switch, and synchronously forming a first gate of the first active switch and a second gate of the second active switch; and synchronously forming a second insulation layer of the first active switch and the second active switch, and synchronously forming a source and a drain of the first active switch and a source and a drain of the second active switch, wherein in the steps of synchronously forming a second insulation layer of the first active switch and the second active switch, and synchronously forming a source and a drain of the first active switch and a source and a drain of the second active switch, the formed source and drain of the first active switch separately connect with the first semiconductor layer of the first active switch, and the formed source and drain of the second active switch separately connect with the second semiconductor layer of the second active switch;

wherein after the steps of synchronously forming a first insulation layer of the first active switch and the second active switch, and synchronously forming a first gate of the first active switch and a second gate of the second active switch, the method comprises the following steps:

forming a fourth photoresist on the second gate, wherein the fourth photoresist is shorter than the second semiconductor layer and longer than the second gate;

heavily doping the second semiconductor layer so that the second semiconductor layer that is not blocked by the fourth photoresist forms a first doped layer, wherein a part blocked by the second gate is an intrinsic layer; and stripping off the fourth photoresist, and lightly doping the second semiconductor layer so that a part between the intrinsic layer and the first doped layer forms a second doped layer.

7. A method for manufacturing a display panel, comprising steps of forming, in a display region of the display panel, a first active switch comprising a first semiconductor layer, and forming, in a non-display region of the display panel, a second active switch comprising a second semiconductor layer, wherein
- a material of the first semiconductor layer formed is an oxide, a material of the second semiconductor layer formed is polysilicon, and the first semiconductor layer and the second semiconductor layer are formed on an identical layer;
- wherein the steps of forming, in a display region of the display panel, a first active switch comprising a first semiconductor layer, and forming, in a non-display region of the display panel, a second active switch comprising a second semiconductor layer comprise the following steps:
- forming the second semiconductor layer in the non-display region;
- forming the first semiconductor layer in the display region;
- synchronously forming a first insulation layer of the first active switch and the second active switch, and synchronously forming a first gate of the first active switch and a second gate of the second active switch; and
- synchronously forming a second insulation layer of the first active switch and the second active switch, and synchronously forming a source and a drain of the first active switch and a source and a drain of the second active switch, wherein in the steps of synchronously forming a second insulation layer of the first active switch and the second active switch, and synchronously forming a source and a drain of the first active switch and a source and a drain of the second active switch, the formed source and drain of the first active switch separately connect with the first semiconductor layer of the first active switch, and the formed source and drain of the second active switch separately connect with the second semiconductor layer of the second active switch;
- wherein the step of forming the first semiconductor layer in the display region comprises the following steps:
- forming a base;
- forming an oxide semiconductor layer on the base;
- forming a photoresist A on the oxide semiconductor layer; and
- etching the oxide semiconductor layer into the first semiconductor layer;
- wherein the step of forming the second semiconductor layer in the non-display region comprises the following steps:
- forming an undoped second semiconductor layer in the non-display region;
- forming a photoresist B on the second semiconductor layer, wherein the photoresist B is shorter than the second semiconductor layer;
- heavily doping the second semiconductor layer so that a part not blocked by the photoresist B forms the first doped layer;
- stripping off the photoresist B, and forming a photoresist C shorter than the photoresist B on the second semiconductor layer, wherein a part of the second semiconductor layer, the part being covered by the photoresist C, is the intrinsic layer;
- lightly doping the second semiconductor layer to form the second doped layer between the first doped layer and the intrinsic layer;
- stripping off the photoresist C; and
- stripping off the photoresist A.

\* \* \* \* \*